United States Patent
Liu et al.

[11] Patent Number: 6,157,331
[45] Date of Patent: Dec. 5, 2000

[54] SIGMA DELTA MODULATOR WITH AUTOMATIC SATURATION DETECTION AND RECOVERY

[75] Inventors: Liusheng Liu; David Ho Seng Poh, both of Singapore, Singapore

[73] Assignee: Tritech Microelectronics, Ltd., Singapore, Singapore

[21] Appl. No.: 09/165,002

[22] Filed: Oct. 1, 1998

[51] Int. Cl.[7] .................................................. H03M 3/00
[52] U.S. Cl. ......................... 341/143; 341/118; 341/120
[58] Field of Search ................................... 341/143, 118, 341/120

[56] References Cited

U.S. PATENT DOCUMENTS

| | | | |
|---|---|---|---|
| 5,012,244 | 4/1991 | Wellard et al. | 341/143 |
| 5,376,892 | 12/1994 | Gata et al. | 327/73 |
| 5,757,301 | 5/1998 | Kuo et al. | 341/143 |
| 5,793,811 | 8/1998 | Yu | 375/247 |

OTHER PUBLICATIONS

P.F. Ferguson et al., "One Bit Higher Order Sigma–Delta AID Converters" IEEE Proceedings ISCAS '90, p 890–893, May 1990.

Chao et al. "A Higher Order Topology for Interpolative Modulators for oversampling AID Convertas", IEEE Transistors, Circuits & Systems, vol. CAS–37, p 309–318.

*Primary Examiner*—Brian Young
*Assistant Examiner*—Jason L W Kost
*Attorney, Agent, or Firm*—George O. Saile; Stephen B. Ackerman

[57] ABSTRACT

In the present invention is described a forward feed sigma delta modulator of higher order having automatic saturation detection and recovery. The modulator is separated into two parts which are connected together when there is no saturation, and disconnected when saturation is detected and recovery takes place. The first part contains an integrator and input output circuitry to allow continuous operation of the modulator. The second part contains additional integrators to provider for a higher order modulator and the saturation detector. The modulator can be constructed of single ended or differential switched capacitor technology, and there is a digital saturation detection scheme.

23 Claims, 8 Drawing Sheets

SIGMA DELTA MODULATOR WITH AUTOMATIC SATURATION DETECTION AND RECOVERY

BACKGROUND OF THE INVENTION

1. Field of Invention

The present invention relates to sigma delta modulators and in particular automatic saturation detection and protection

2. Description of Related Art

A sigma delta analog to digital converter, constructed of a sigma delta modulator and a digital filter, has come into widespread use with the development of process technology for use in digital audio and other applications. Excellent linearity and low quantization noise are the hallmark of a sigma delta modulator. This is a result of the use of oversampling and noise shaping techniques.

A sigma delta modulator utilizes a low resolution quantizer and to reduce the quantization noise a feedback structure is employed. A quantized analog signal is fed back and subtracted from the input analog signal to generate an error signal. The error signal passes through a filter which possesses high in-band frequency gain and high out-band frequency attenuation which shapes the quantization noise spectrum. The filter has at least one integrator circuit with more integrator circuits raising the order of the modulator. Higher order modulators more effectively shift quantization noise to out-band frequencies, but higher order modulators are more prone to having stability problems. Loops which are conditionally stable can become unstable under some conditions. In certain instances a modulator could approach saturation where the internal integrator voltage increases until it is clipped to the power supply and resulting in sustained oscillations. Extra reset circuitry is being used to force the integrators out of saturation and back to normal operating conditions.

In U.S. Pat. No. 5,012,244 (Wellard et al.) a multi-stage sigma delta modulator is described with saturation and instability detection, and saturation depression When instability is detected by a comparator circuit, a zeroing circuit connected to at least one of the integrator stages of the modulator to return the modulator to normal operating conditions. In U.S. Pat. No. 5,376,892 (Gata) when an integrator output voltage is detected to be greater than a trip voltage, resetting circuitry coupled with the trip voltage detector softly bring the output voltage lower than the trip voltage. This allows continuous operation as opposed to waiting for recovery from a hard reset.

In "A Higher Order Topology for Interpolative Modulators for Oversampling A/D Converters" (Chao et al.), IEEE Transistors, Circuits and Systems, Vol. CAS-37, pp 309–318, March 1990, a novel topology for constructing a stable interpolative modulator of arbitrary order is described. Higher order modulators are shown not only reduce oversampling but also to randomize the quantization noise to avoid the need for dithering. In "One Bit Higher Order Sigma Delta A/D Converters" (Ferguson et al.), IEEE Proceedings ISCAS '90, pp 890–893, May 1990, A topology for higher order sigma delta modulators is described and synthesis equations are given which allow for the shaping of the signal and quantization noise transfer functions.

Some sigma delta modulator designs impose a hard reset on the circuitry to force a recovery from saturation and possible instability. Many clock cycles are used up waiting for the recovery to happen and all the while there is an interrupted output of the circuitry. This produces a loss of data and establishes a need to control saturation conditions where instability might occur without interrupting the flow of information from the input to the output of a sigma delta modulator.

SUMMARY OF THE INVENTION

In the preferred embodiment of the present invention a sigma delta modulator is separated into two parts. An input circuit forming the first part contains input and output circuitry along with a first integrator circuit. The second part contains additional integrator circuits, serially connected, to form a higher order modulator and a saturation voltage detector. The first part and the second part are connected together by switches controlled by the output of the saturation detector. When no saturation voltage is detected, the first part is connected to the second part forming a high order forward feed sigma delta modulator. When saturation is detected the first part is disconnected from the second part, and the first part provides a sigma delta modulator of order one with continuous input and output operations.

During the time there is no saturation, the outputs of the integrators are summed together and connected to a quantizer circuit. The output of the quantizer circuit produces a one bit digital output of the modulator. The one bit output is negatively fed back to a summing junction at the input of the first integrator circuit and combined with the analog input signal. This feedback structure forms a tracking error signal that is integrated over time minimizing any accumulated tracking errors making the average amplitude of the modulators digital output approximately equal to the average analog input.

When saturation is detected, the first part of the sigma delta modulator is disconnected from the second part under the control of the saturation detector. The first order sigma delta modulator of the first part continues to operate and produces a one bit digital output while the integrator circuits in the second part are controlled in a negative linear feedback to come out of saturation. The saturation control is maintained for a period of time sufficient for the integrator circuits to recover from saturation. After the allotted time for recovery from saturation, the first part and the second part of the modulator are reconnected and the modulator continues operation as a higher order sigma delta modulator.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
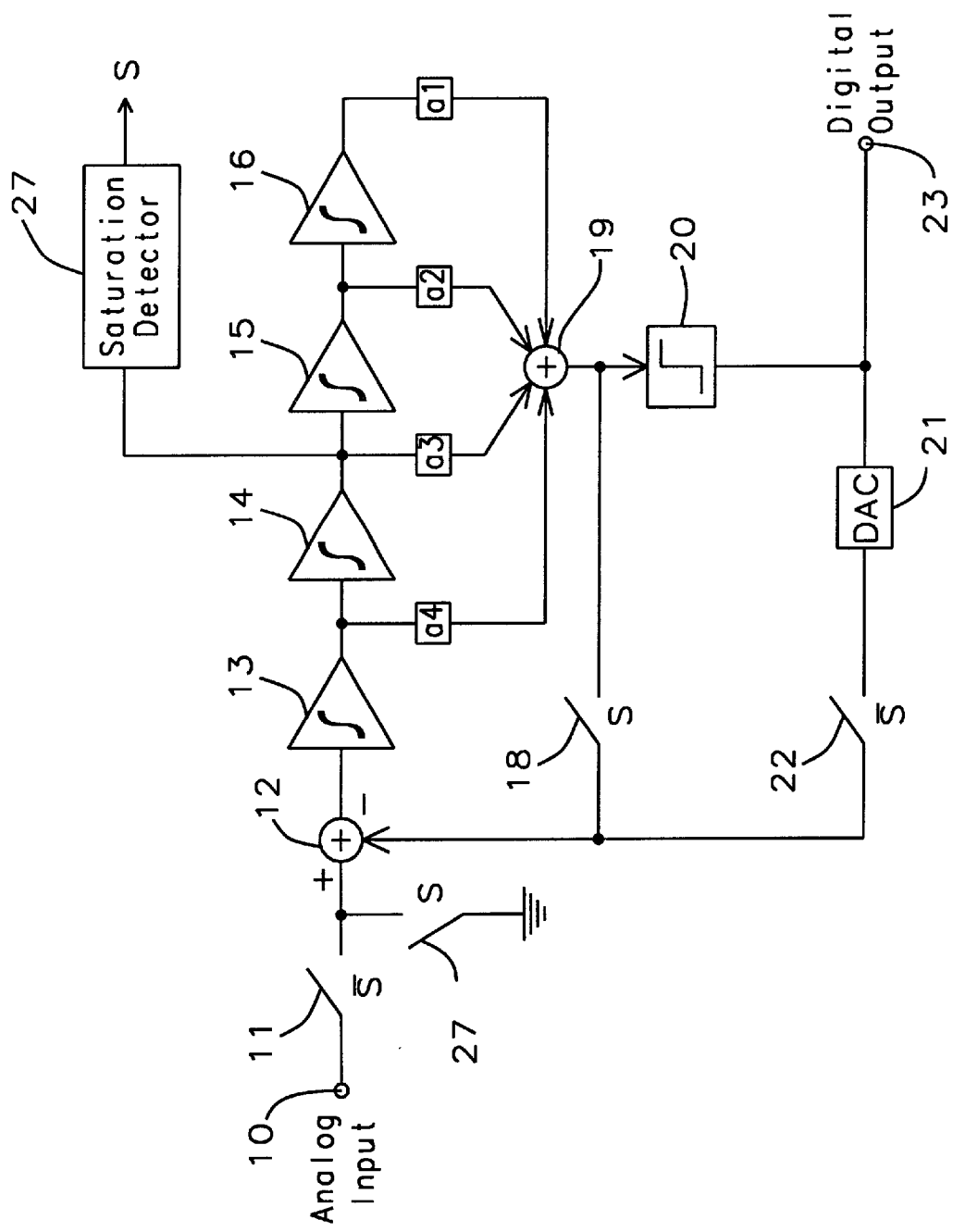
FIG. 1 is a block diagram of a fourth order sigma delta modulator with interrupted analog input.

In FIG. 1 is shown an a fourth order forward feed sigma delta modulator circuit with saturation detection and recovery. An analog input is connected to the first integrator circuit 13 of four integrators 13, 14, 15, and 16 through a switch 11 and a summing junction 12. Switch 11 is closed when the saturation detector 27 connected to the output of the second integrator 14 does not detect a saturation voltage. To detect saturation the saturation detector 27 could also be connected to the output of either the third integrator 15 or the fourth integrator 16. Additional integrator stages could be connected in series with the fourth integrator 16 to form a higher order sigma delta modulator circuit.

Continuing to refer to FIG. 1, the output of each integrator circuit 13, 14, 15 and 16 is connected to a parameter circuit a1, a2, a3 and a4 through which the outputs of the integrators are connected to a summing junction 19. The summed outputs of the parameter circuits a1, a2, a3, and a4 are connected to a quantizer circuit 20 which produces the digital output 23 of the modulator. The digital output 23 is fed back through a DAC 21 and through a switch 22 to the summing junction 12 at the input of the first integrator 13. Switch 22 is closed when no voltage saturation is detected by the saturation detector 27.

Continuing to refer to FIG. 1, When saturation is detected switches 11 and 22 are opened and switches 17 and 18 are closed. The analog input is disconnected from the modulator, and the feedback of the digital output 23 is disconnected from the input summing junction 12. Switch 18 is closed which linearly feeds back the outputs of the integrator circuits 13, 14, 15 and 16 through the parameter circuits al, a2, a3 and a4 and summing junction 19. Switch 17 is closed when saturation is detected and connects the input summing junction 12 to ground. The connection of the input summing junction 12 to ground along with the linear feed back of the outputs of the integrators 13, 14, 15 and 16, brings the integrator circuits out of saturation. After waiting a predetermined amount of time for the integrators to recover from saturation, switches 17 and 18 are opened and switches 11 and 22 are closed so that the circuitry can resume normal operation.

Figure 2:
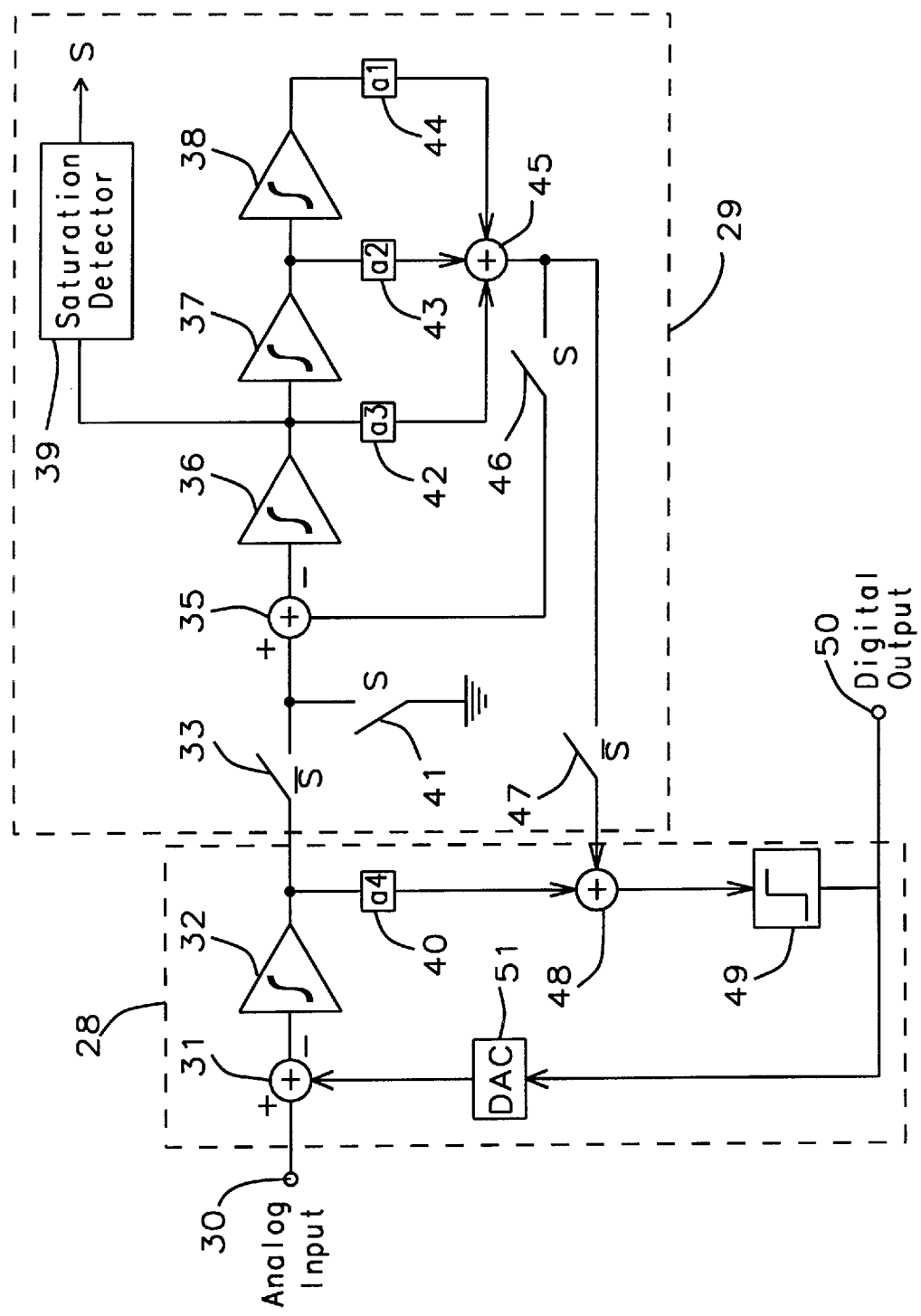
FIG. 2 is a block diagram of a fourth order sigma delta modulator with continuous input and output operations.

Referring to FIG. 2 a block diagram of the preferred embodiment of this invention is shown. This configuration is partitioned into two parts 28 and 29. The first part 28 contains input and output circuitry and is connected to a second part 29 through switches 33 and 47. Contained within the first part 28 is the analog input 30 to the sigma delta modulator, an input summing junction 31, a first integrator circuit 32 connected through a parameter circuit 40 to an output summing junction 48 which is farther connected to a quantizer 49. The output of the quantizer 49 produces the digital output 50 of the modulator. The output of the quantizer 49 is fed back to the input summing junction 31 through a one bit DAC 51. This feedback between the output 50 and the input summing junction 31 produces an error signal at the input summing junction 31 that is integrated over time making the average amplitude of the modulator output signal 50 approximately equal to the average of the input signal 30. A digital output 50 is continuously produced which represents the analog input 30 even during saturation recovery because the circuitry that saturates is contained with in the second part 29 which is disconnected from the first part 28 by switches 33 and 47 during saturation recovery.

Continuing to refer to FIG. 2, the second part 29 connected to the first part 28 through switches 33 and 47 contains the remainder of the integrators 36, 37 and 38 of the sigma delta modulator, a saturation detector 39 and parameter circuits 42, 43, and 44 connected to the outputs of the integrators. Additional integrators could be added to the second part 29 connected similarly as integrators 36, 37 and 38 and making the modulator higher than a fourth order. When no saturation is detected by the saturation detector 39, switches 41 and 46 are open and switches 33 and 47 are closed. This connects the first part 28 containing the first integrator 32 and the associated the input and output circuitry to the second part 29 containing the additional integrators 36, 37 and 38 and the saturation detector 39.

Continuing to refer to FIG. 2, integrators 36, 37 and 38 are serially connected with their outputs connected to parameter circuits 42, 43 and 44. The output of the parameter circuits 42, 43 and 44 are summed together in a summing junction 45 and connected to an output summing junction 48 in the first part 28 by switch 47 when there is no integrator circuit saturation. Thus the outputs of all the integrators 32, 36, 37 and 38 through parameter circuits 40, 42, 43 and 44 and summing junction 45 are finally summed together in the output summing junction 48. This final summation is connected to the quantizer circuit 49 which produces the output 50 of the modulator. The output 50 is fed back to the input summing junction 31 through DAC 51 to create an error signal that is integrated over time to produce an average digital output 50 which is approximately equal to the average of the analog input 30.

Continuing to refer to FIG. 2, when saturation is detected the saturation detector issues a signal that opens switches 33 and 47, which disconnects the first part 28 of the circuitry from the second part 29, and closes switches 41 and 46. Switch 41 connects ground to the summing junction 35 at the input to the second integrator 36. Switch 46 linearly feeds back the summation of the output of the integrators 36, 37 and 38 through the parameter circuits 42,43 and 44. This linear feedback coupled with connecting circuit ground to the second integrator 36 through an input summing junction 35 forces the integrators out of saturation. A predetermined amount of time is allowed for recovery from saturation before switches 41 and 46 are opened and switches 33 and 47 are closed, reconnecting the two parts 28 an 29 back together. The saturation detector 39 is shown in FIG. 2 to be connected to the output of the second integrator 36, but it could be connected to output of any subsequent integrator 37 or 38.

Figure 3:
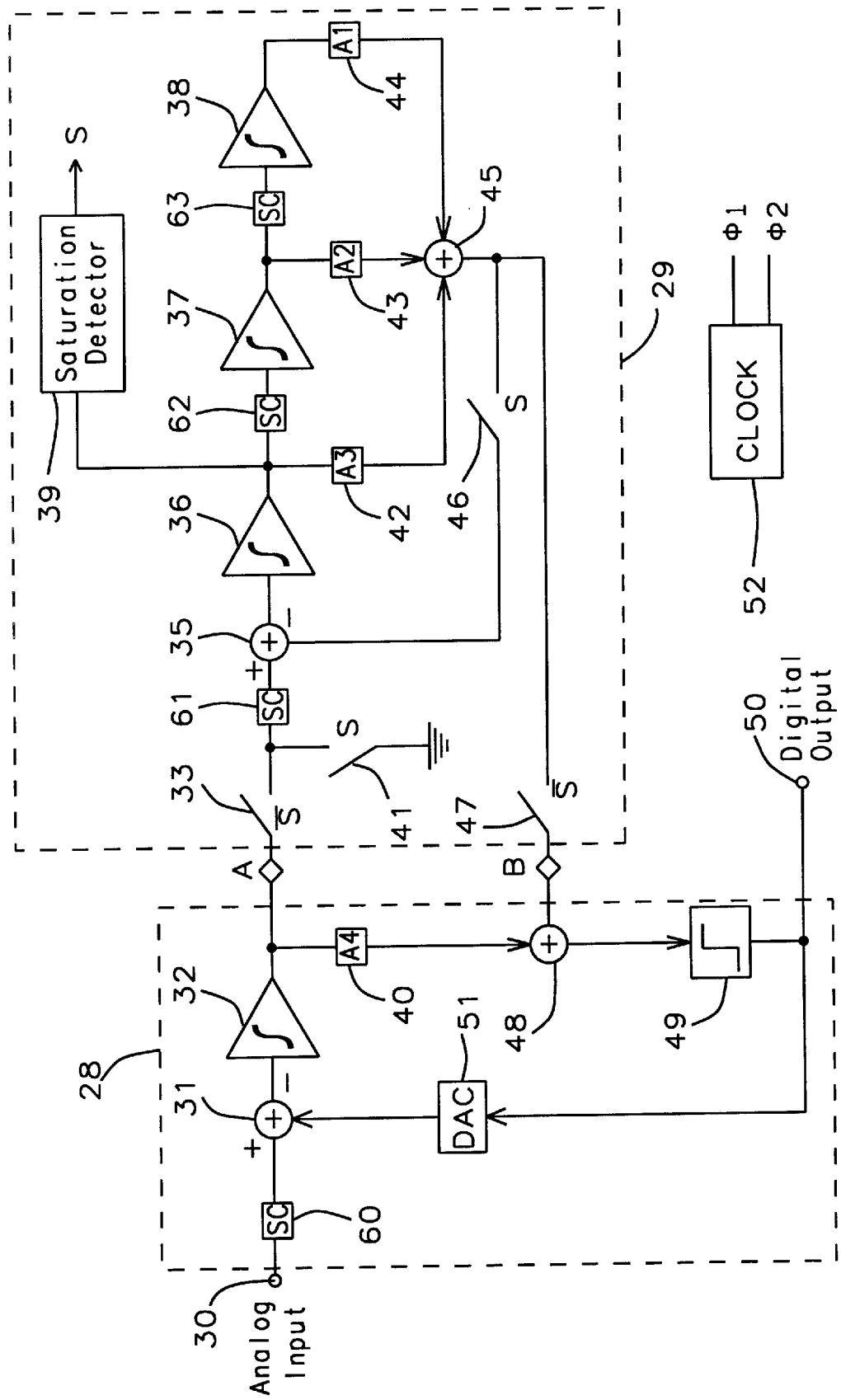
FIG. 3 is a block diagram of a switched capacitor implementation of a fourth order sigma delta modulator with continuous input and output operations.

Shown in FIG. 3 is a block diagram of a switched capacitor implementation of the preferred embodiment configuration of FIG. 2. The configuration is partitioned into two parts 28 and 29. In the first part 28 a switched capacitor circuit 60 is connected between the analog input 30 and the input summing junction 31 to the first integrator 32. The parameter circuit 40 connected to the output of the first integrator circuit 32 is implemented in switched capacitor technology. The output of the parameter circuit 40 is connected to quantizer circuit 49 through a summing junction 48. The quantizer 49 produces the output of the modulator which is fed back to the input summing junction 31 through a one bit DAC 51. The DAC 51 is also implemented in switched capacitor technology.

Continuing to refer to FIG. 3, the first part of the modulator 28 is connected to the second part 29 through switches 33 and 47. Nodes "A" and "B" are shown on the connections between the first part 28 and the second part 29 as a reference and are used in FIG. 4 and FIG. 5. In the second part 29 the signal from the first integrator 32 is connected to the summing junction 35 at the input of the second integrator 36 through switch 33 and switched capacitor circuit 61. Switch 33 is closed when the saturation detector 39 does not detect integrator saturation. The output of the second integrator 36 is connected to the input of the third integrator 37 through switched capacitor circuit 62. The output of third integrator 37 is connected to the input of fourth integrator 38 through switched capacitor circuit 63. Parameter circuit 42 is connected between the output of the second integrator 36 and the summing junction 45. In like manner parameter circuit 43 is connected between output of integrator 37 and summing junction 45, and parameter circuit 44 is connected between the output of the fourth integrator 38 and the summing junction 45. The output of the summing junction 45 is connected to the output summing junction 48 in the first part 28 through switch 47. Switch 47 is closed when no saturation is detected.

Continuing to refer to FIG. 3, when saturation is detected, the saturation circuit 39 produces a signal "S" which opens switches 33 and 47 disconnecting the first part 28 from the second part 29, and closes switches 41 and 46. Switch 41 connects circuit ground to the input summing junction 35 through switched capacitor circuit 61, and switch 46 negatively feeds back summing junction 45 to input summing junction 35. Switch 41 provides and grounded input to the summing junction 35 at the input of the second integrator 36 and switch 46 connects a negative linear feedback to force the integrators 36, 37 and 38 out of saturation. After a predetermined amount of time sufficient for recovery from saturation, switches 41 and 46 are opened and switches 33 and 47 are closed reconnecting part one 28 to part two 29. During the time that the two parts of the modulator 28 and 29 were not connected together, a digital output 50 is produced by the quantizer circuit 49 in which the average amplitude of the digital output pulse over time was approximately equal to the average of the analog input 30. This is also true when the two parts 28 and 29 of the modulator are connected together so that a digital output 50 is continuously produced regardless of the two parts 28 and 29 of the modulator being connected together or not. A clock 52 producing two orthogonal non-overlapped clock pulses is used to control the switches of the switched capacitor circuits.

Figure 4:
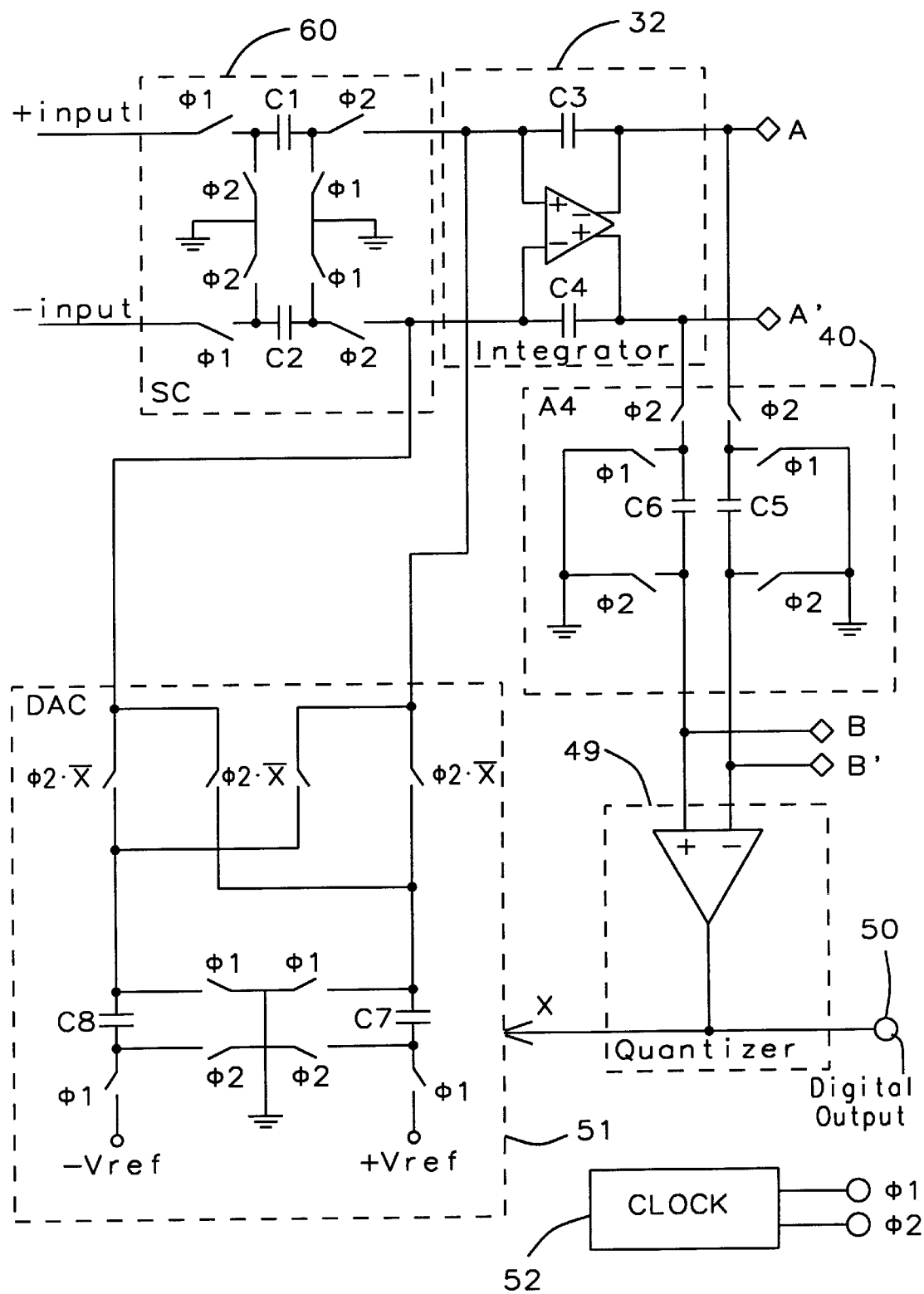
FIG. 4 is a schematic diagram the input part of a differential switched capacitor implementation of a fourth order sigma delta modulator.

In FIG. 4 is shown the first part 28 of the sigma delta modulator of FIG. 3 implemented in a differential switched capacitor technology. It should be noted that a single ended switched capacitor configuration can also be used to implement the sigma delta modulator. The clock 52 provides two orthogonal non-overlapped clocks named $\phi 1$ and $\phi 2$. The $\phi 1$ clock samples an input voltage onto sampling capacitors, and the $\phi 2$ clock transfers charge on the sampling capacitors to the integrating capacitors. As an example in the switched capacitor circuit 60 connecting the differential analog input signal to the first integrator 32, when there is a $\phi 1$ clock pulse the +input and the –input signals are applied across the two sampling capacitors C1 and C2. During the $\phi 2$ clock pulse the charge on the capacitors C1 and C2 is transferred to the integrating capacitors C3 and C4 of differential integrator 32.

Continuing to refer to FIG. 4, the output of the differential integrator 32 is connected to circuit nodes A and A' and the parameter circuit 40. The circuit nodes A and A' designate connections to the second part 29 of the modulator. The parameter circuit 40 is constructed of switched capacitor technology in which the capacitors C5 and C6 are chosen to have an appropriate value to produce a proper operating sigma delta modulator. The differential output signals of the integrator are sampled onto the capacitors C5 and C6 by means of the switches under control of the $\phi 2$ clock pulse. During the $\phi 1$ clock the charge on the capacitors C5 and C6 is connected to the input of the quantizer 49 and to the second part 29 of the modulator through circuit nodes B and B'.

Continuing to refer to FIG. 4, The output of the quantizer 49 produces the digital output 50 of the sigma delta modulator and provides the same output signal, noted as X, to the one bit DAC 51. The DAC 51 is constructed of switched capacitor technology in which a +Vref and a −Vref is connected to the summing junction at the input of the first integrator 32. The value of X determines which reference voltage +Vref or −Vref is connected to which input leg of the summing junction of the differential integrator 32. When the output voltage of the modulator is of value X, the output switches of the DAC are controlled by the logical AND of the $\phi 2$ clock and X, noted on FIG. 4 as $\phi 2 \cdot X$. When the output voltage of the modulator is not of value X, the output switches of the DAC are controlled by the logical AND of the $\phi 2$ clock and not X, noted on FIG. 4 as $\phi 2 \cdot \overline{X}$.

Continuing to refer to FIG. 4, during the $\phi 1$ clock +Vref is applied to capacitor C7 and −Vref is applied to capacitor C8 of the one bit DAC 51. If the quantizer output is X, the charge on C7 is connected the negative summing junction of the first integrator 32, and the charge on C8 is connected to the positive summing junction of the first integrator 32. When the quantizer output is not X, the charge on C7 is connected to positive sunning junction of the first integrator 32, and the charge on C8 is connected to the negative summing junction of the first integrator 32.

Figure 5:
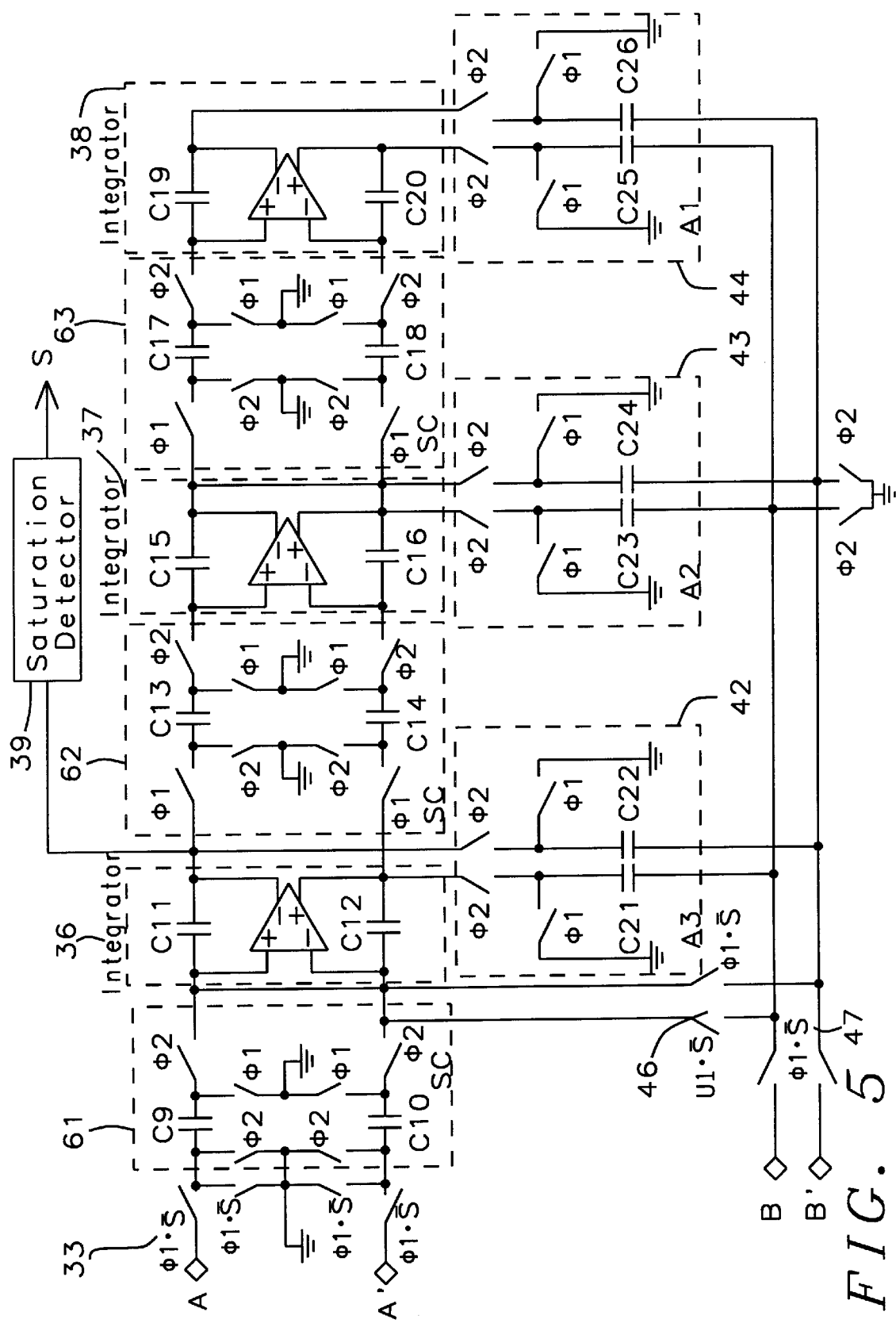
FIG. 5 is a schematic diagram the second part of a differential switched capacitor implementation of a fourth order sigma delta modulator.

Referring to FIG. 5, a differentially connected switched capacitor configuration of the second part 29 of the sigma delta modulator is shown. When there is no saturation signal, the input switches connecting the switched capacitor circuit 61 to circuit nodes A and A' are closed when the $\phi 1$ clock is applied as noted by $\phi 1 \cdot \overline{S}$ which is the logical AND of the $\phi 1$ clock and the not saturated signal from the saturation detector 39. If saturation is detected, the $\phi 1 \cdot \overline{S}$ switches are opened and the $\phi 1 \cdot S$ controlled switches are closed connecting ground to the switched capacitor circuit 61 during the $\phi 1$ clock pulse.

Continuing to refer to FIG. 5, when there is no saturation, signals from the first part 28 connected to nodes A and A' are sampled onto C9 and C10 during the $\phi 1$ clock pulse. The charge on C9 and C10 is transferred to the capacitors C11 and C12 of second integrator 36 during the $\phi 2$ clock. The output of the second integrator 36 is clocked through the switched capacitor circuit 62 containing capacitors C13 and C14 by using first the $\phi 1$ clock pulse and then the $\phi 2$ clock pulse. The charge on capacitors C13 and C14 is transferred to capacitors C15 and C16 of the third integrator 37. The output of the third integrator 37 is clocked through the switched capacitor circuit 63 to the fourth integrator 38 using first the $\phi 1$ clock pulse and then the $\phi 2$ clock pulse.

Continuing to refer to FIG. 5, connected to output of the second integrator 36 is a saturation detector 39 producing an output S when saturation occurs and a parameter circuit 42 containing capacitors C21 and C22 which samples the output of the second integrator 36 during the φ2 clock pulse. The parameter circuit 42 transfers the sampled charge to the first part of the modulator through circuit nodes B and B' during the φ1 clock pulse when there is no saturation signal, φ1·S̄. Similarly the output of the third integrator is sampled by capacitors C23 and C24 in parameter circuit 43, and the output of the fourth integrator is sampled by capacitors C25 and C26 in parameter circuit 44. The φ2 clock pulse controls the sampling of the integrator outputs and the φ1 clock pulse transfers the sampled charge to the summing node of the first part 28 of the modulator through differential switches 47 and circuit nodes B and B'.

Continuing to refer to FIG. 5, when there is a saturation detector signal S, the switched capacitor circuit 61 is disconnected from the first part of the modulator 28 and circuit nodes A and A' through switches 33 controlled open by φ1·S̄. Similarly differential switches 47 are controlled to be opened by φ1·S̄ disconnecting the output of parameter circuits 42, 43 and 44 from the first part of the modulator 28. The output of the parameter circuits 42, 43 and 44 is fed back to the summing junction at the input of the second integrator 36 through differential switch 46 by the signal φ1·S. This feedback along with the grounding of the inputs to switched capacitor circuit 61 controls the recovery of the integrator circuits 36, 37 and 38 from saturation.

Referring to FIG. 4 and FIG. 5, an alternate method of detecting saturation is to replace the saturation voltage detector 39 at the output of the second integrator 36 with monitoring of consecutive logic pulses of the same value at the output of the quantizer 49. This method would determine the integrators 36, 37 and 38 to be saturated when a predetermined number of consecutive pulses of the same logical value were generated by the quantizer. The second part of the modulator 29 would be disconnected from the first part 28 for a predetermined number of clock pulses sufficient to allow the integrators to recover from saturation. After the predetermined number of clock pulses to allow recovery, the two parts of the modulator 28 and 29 would be reconnected and normal operations would continue. During recovery from saturation the first part 28 would continue to produce an output 50 as a result of an analog input signal 30 to the first part of the modulator 28.

Figure 6:
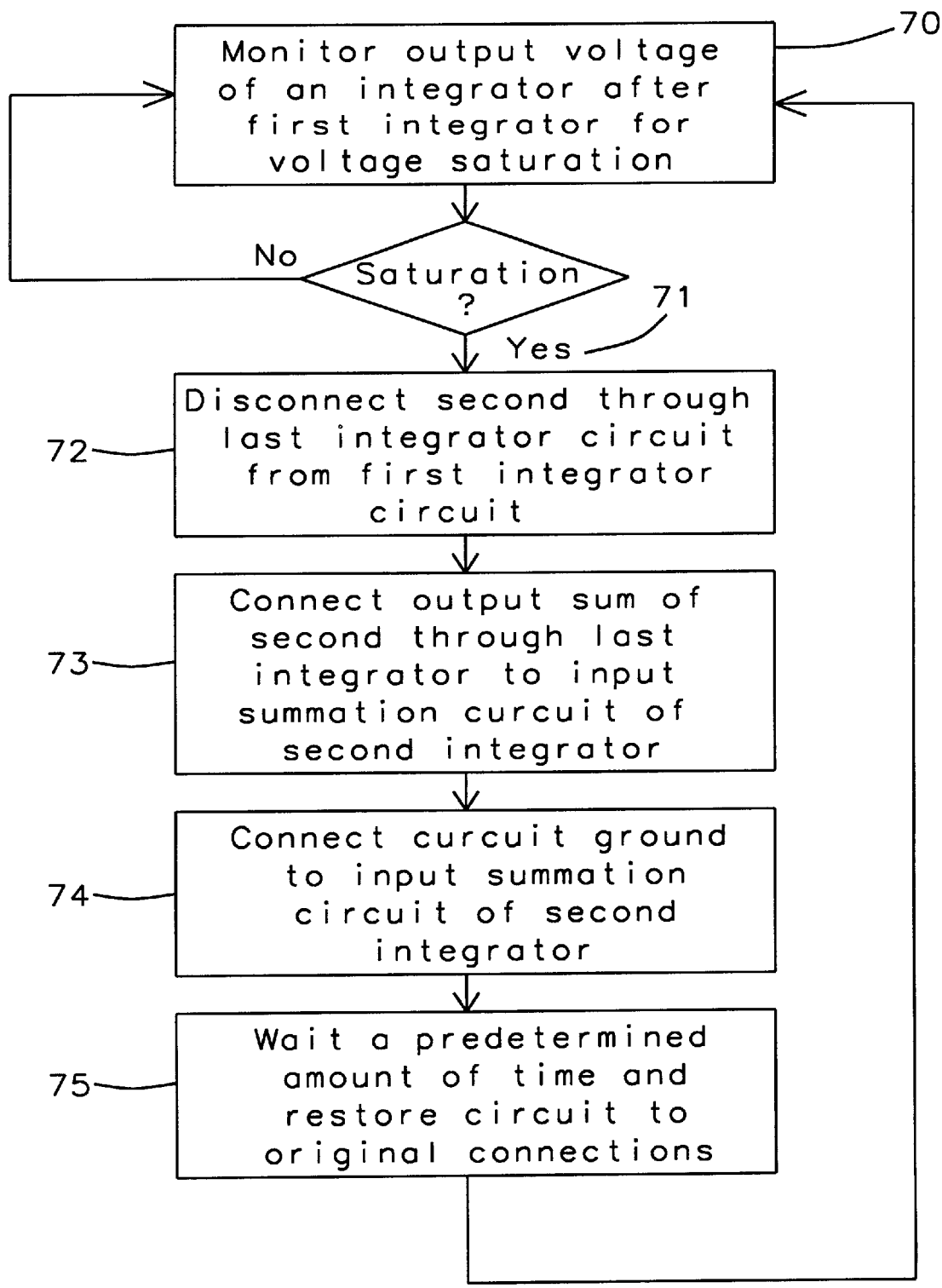
FIG. 6 is a flow diagram of an analog method of monitoring and correcting saturation in a sigma delta modulator.

In FIG. 6 is shown a method to determine saturation of the integrators in a forward feed sigma delta modulator using voltage detection of the second or subsequent integrators. Monitor the output of an integrator circuit after the first integrator circuit for voltage saturation 70. When saturation is detected 71, disconnect the second through last integrator circuit from the first integrator circuit. Connect the output of parameter circuits of the second through last integrator to input summing circuit of second integrator 73 and connect ground to input summing circuit of the second integrator 74. Wait a predetermined amount of time and restore circuit to original connections 75.

Figure 7:
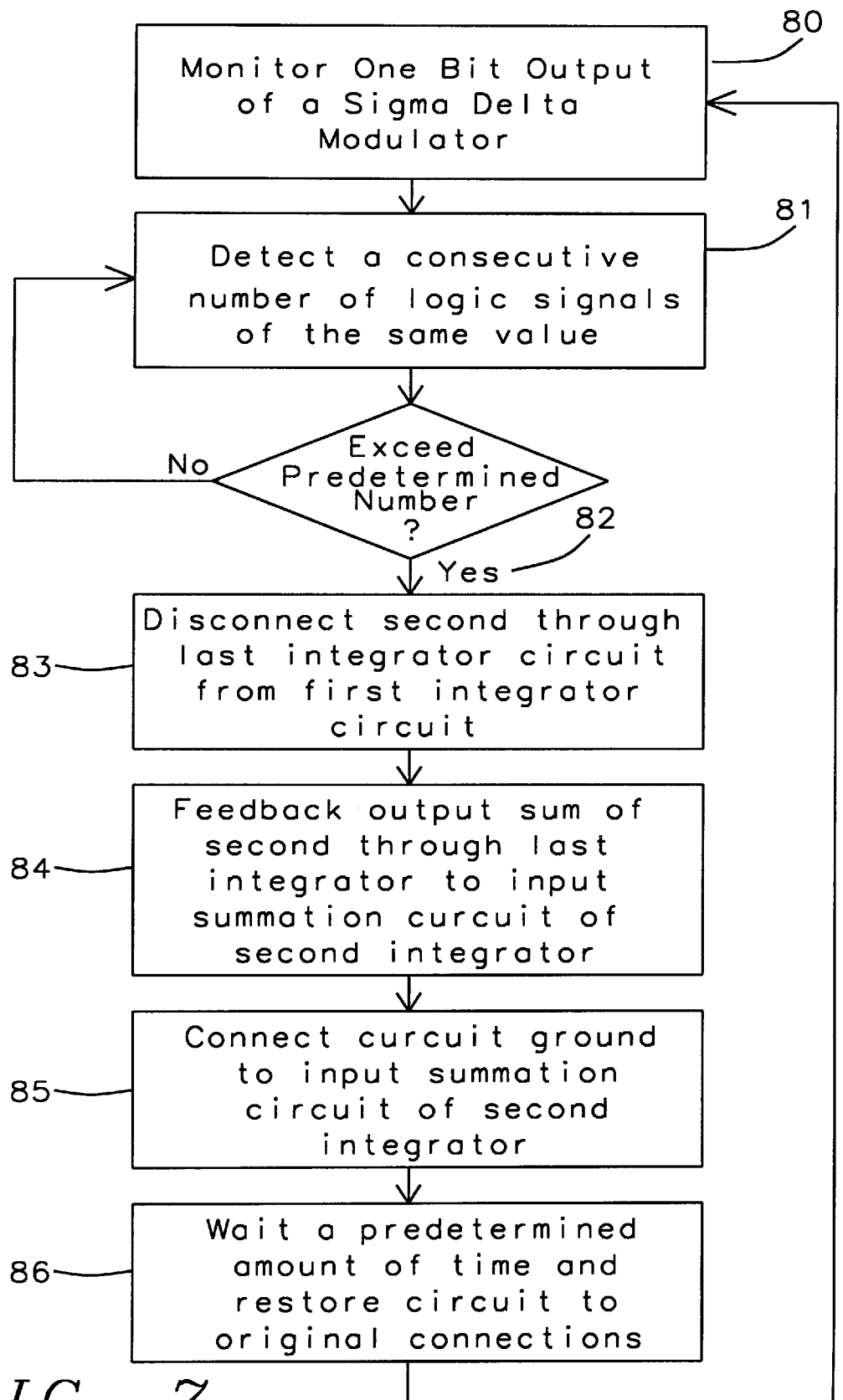
FIG. 7 is a flow diagram of a digital method of monitoring and correcting saturation in a sigma delta modulator.

In FIG. 7 is shown a method of determining saturation of the integrators of a forward feed sigma delta modulator using digital means. Monitor the one bit output of the sigma delta modulator 80. Detect the consecutive number of logic signals of the same value 81. The number of consecutive logic signals of the same value needed to predict saturation is between about ten and eighteen. If the consecutive number of logic signals of the same value exceeds a predetermined number 82, disconnect the second through last integrator circuit from the first integrator circuit 83. Feedback the output of parameter circuits connected to integrators to input of second integrator 84 and connect ground to input summing circuit of the second integrator 85. Wait a predetermined number of clock pulses, between about eighty and one hundred, that is sufficient to allow recovery from saturation and restore circuit to original connections 86.

Figure 8A:
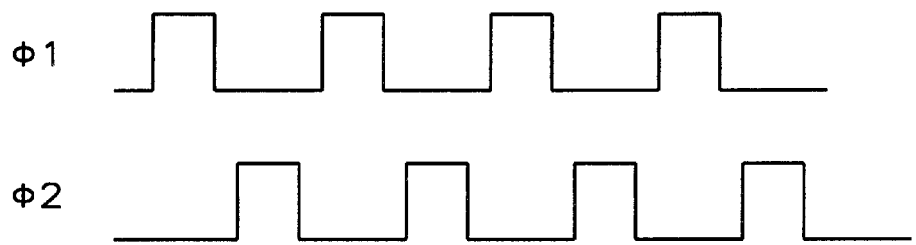
FIG. 8a shows the relationship of the clocks required in a switched capacitor implementation of a sigma delta modulator.
Figure 8B:
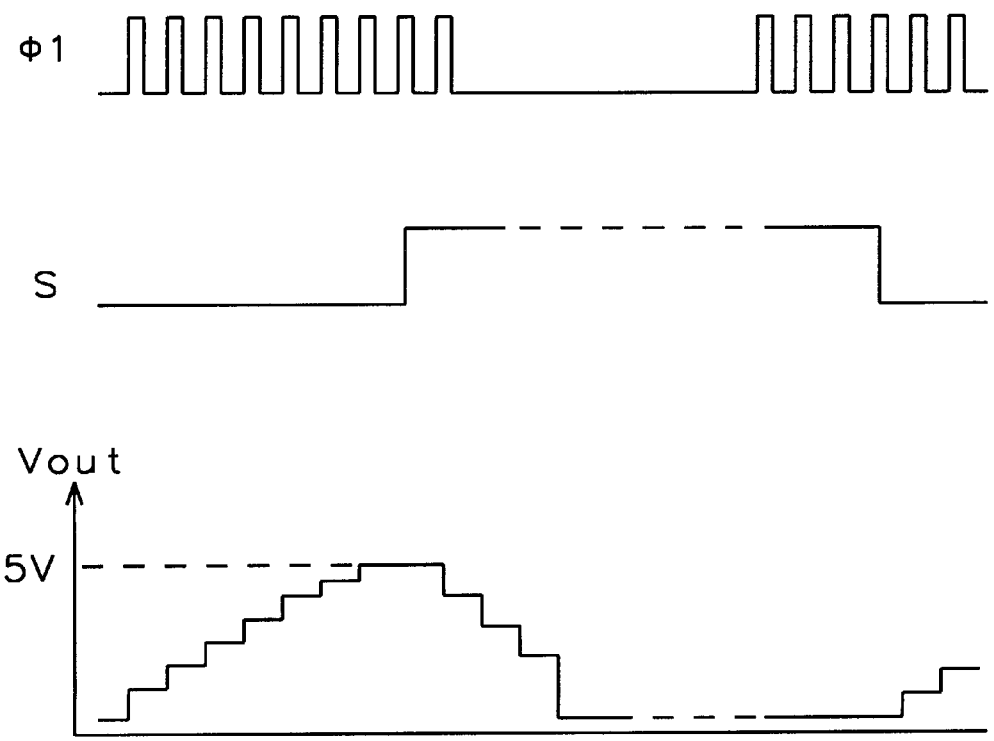
FIG. 8b shows the relationship of the phase one clock, the saturation detection signal and an integrator circuit output in a switched capacitor implementation of a sigma delta modulator.

Shown in FIG. 8a are the φ1 and φ2 clock pulses for the switched capacitor implementation of the sigma delta modulator. The two clock pulses shown are orthogonal and non-overlapped. This allows the switched capacitors to sample a voltage with one clock and then transfer the charge with the second clock. In FIG. 8b is shown the relationship between the φ1 clock, the saturation detection signal S and the output of an integrator that has gone into saturation and recovers after the saturation signal S is applied.

While the invention has been particularly shown and described with reference to preferred embodiments thereof, it will be understood by those skilled in the art that various changes in form and details may be made without departing from the spirit and scope of the invention.

What is claimed is:

1. A sigma delta modulator circuit, comprising:
   a) an input circuit containing a first integrator circuit forming a first order sigma delta modulator and connected to produce a quantized output from an analog input signal,
   b) a set of serially connected integrator circuits connected to said input circuit and further connected to a saturation detector circuit,
   c) said first integrator circuit forming a high order sigma delta modulator in conjunction with said set of serially connected integrator circuits when saturation is not detected by said saturation detector,
   d) said set of serially connected integrator circuits disconnected from said input circuit by said saturation detector circuit when saturation is detected, leaving said first order sigma delta modulator operating between said analog input and said quantized output.

2. The sigma delta modulator circuit of claim 1, wherein circuitry of said input circuit and said set of serially connected integrator circuits are differentially connected.

3. The sigma delta modulator circuit of claim 1, wherein switched capacitor technology is used to connect between circuit elements, form parameter circuits and provide a DAC for feeding back said quantized output to input of said input circuit.

4. The sigma delta modulator circuit of claim 1, wherein digital techniques are used to detect saturation.

5. A continuously operating sigma delta modulator circuit, comprising:
   a) a first circuit part comprising an input circuit connected to a first integrator circuit, a quantizer connected to output of said first integrator circuit through a parameter circuit summing junction, and a DAC feeding back output of said quantizer to input of said first integrator circuit,
   b) a second circuit part comprising several integrator circuits connected in series from a second integrator circuit to a last integrator circuit with outputs of each integrator circuit connected through parameter circuits to a summing junction and a saturation detector monitoring an output of one of said several integrator circuits,
   c) output of said saturation detector controlling switches connecting said second circuit part to said first circuit part,
   d) an input to said second circuit part connected to said first circuit part when saturation is not detected by said saturation detector, e) said input to said second circuit part disconnected from said first circuit and controlled to recover from saturation when a saturation signal is detected by said saturation detector, f) said second circuit part reconnected to said first circuit part when said saturation signal is not detected by said saturation detector.

6. The sigma delta modulator circuit of claim 5, wherein switched capacitor technology is used to connect between circuit elements, form said parameter circuits, and provide the DAC circuits, and wherein circuitry of said first part and said second part are differentially interconnected.

7. The sigma delta modulator circuit of claim 6 wherein digital techniques are used to detect and recover from saturation, comprising:

a) saturation detected by determining a number of successive clocked signals at output of said quantizer of same logical value, b) input and output of said second circuit part disconnected from said first circuit part for a predetermined number of clock cycles, c) output of said second circuit part connected to input of said second circuit part for said predetermined number of clock cycles, d) said second circuit part reconnected to said first circuit part after said predetermined number of clock cycles and said second circuit part has recovered from saturation.

8. The sigma delta modulator circuit of claim 5, wherein the first circuit part contains an input and output of a first order modulator circuit, and produces an output signal corresponding to an input signal during recovery from saturation and during normal operations when there is no saturation.

9. The sigma delta modulator circuit of claim 5, whereupon detection of saturation said input of said second part is grounded and an output of said second circuit part formed by summing outputs of said parameter circuits is negatively fed back to input summing junction of said second integrator circuit under the control of the saturation detector to form a linear sigma delta feedback loop and allow said modulator circuit to recover from saturation.

10. The sigma delta modulator circuit of claim 5, wherein circuitry of said first part and said second part are differentially interconnected.

11. A modulator circuit, comprising:

a) a series connected forward feed sigma delta modulator, b) several integrator circuits connected in series with an output of a first integrator circuit connected to an input of a second integrator circuit and continuing to an output of a next to last integrator circuit connected to an input of a last integrator circuit, c) parameter circuits connected to outputs of said several integrator circuits with outputs of said parameter circuits summed together in an output summing junction and connected to input of a quantizer circuit, d) said output summing junction connected to an input summing junction of said first integrator circuit through a first feedback switch, e) output of said quantizer circuit producing a digital output of said sigma delta modulator and connected to a one bit DAC, f) output of said DAC fed back through a second feedback switch to said input summing junction of said first integrator circuit, g) analog input to said sigma delta modulator connected through a first input switch to said input summing junction, h) a second input switch connecting circuit ground to said input summing junction, i) a saturation detector connected to output of one of said several integrator circuits connected in series to said first integrator circuit, j) output of said saturation detector controlling said first and second input switches and said first and second feedback switches.

12. The modulator circuit of claim 11, wherein said sigma delta modulator is implemented in switched capacitor technology and digital techniques are used to detect and recover from saturation.

13. The sigma delta modulator circuit of claim 12, wherein said sigma delta modulator is implemented in switched capacitor technology and digital techniques are used to detect and recover from saturation.

14. The modulator circuit of claim 11, wherein saturation detector selects first input switch and second feedback switch when there is no circuit saturation.

15. The modulator circuit of claim 11, wherein saturation detector selects second input switch and first feedback switch when circuit saturation is detected.

16. The modulator circuit of claim 11, wherein said sigma delta modulator is implemented in a differential circuit configuration.

17. A method of detecting sigma delta modulator saturation and recovery, comprising:

a) monitoring an output voltage of an integrator circuit subsequent to a first integrator circuit for voltage saturation, b) disconnecting a second integrator circuit through a last integrator circuits from said first integrator circuit, c) feeding back outputs of parameter circuits connected to said second through last integrator circuits to an input summation circuit of said second integrator circuit, d) connecting circuit ground to input summation circuit of said second integrator circuit, e) waiting a predetermined amount of time for circuitry to recover from saturation and restoring circuits to original connections, f) retuning to step (a) and monitoring said output voltage of said integrator circuit subsequent to said first integrator circuit for voltage saturation.

18. The method of claim 17, wherein monitoring output voltage for saturation is accomplished at output of said second integrator circuit.

19. The method of claim 17, wherein waiting said predetermined number of clock cycles for circuitry to recover from saturation is between about 80 and 100 clock cycles.

20. A method for detecting sigma delta modulator saturation and recovery using digital techniques, comprising:

a) monitoring a one bit output of a switched capacitor coupled sigma delta modulator, b) detecting a predetermined number of consecutive logic signals of a same value and turning on a saturation signal, c) disconnecting a second integrator circuit through last integrator circuits from a first integrator circuit, d) feeding back output sum of parameter circuits connected to said second through last integrator circuits to an input summation circuit of said second integrator circuit, e) connecting circuit ground to input summation circuit of said second integrator circuit, f) waiting a predetermined number of clock cycles for circuitry to recover from saturation, turning off saturation signal and restoring circuits to original connections, f) returning to step (a) and monitoring said one bit output of said switched capacitor coupled sigma delta modulator.

21. The method of claim 20, wherein clocking of said switched capacitors is done with phase one and phase two clock with a saturation signal being anded with clock signals to control connections between first stage containing said first integrator circuit and subsequent stages of said modulator containing said second through last integrator circuits.

22. The method of claim 20, wherein detecting a predetermined consecutive number of logic signals of a same value at output of said modulator is between about 10 and 18 clock cycles.

23. The method of claim 20, wherein waiting a predetermined number of clock cycles for circuitry to recover from saturation is between about 80 and 100 clock cycles.

* * * * *